US006218867B1

(12) United States Patent
Imai et al.

(10) Patent No.: US 6,218,867 B1
(45) Date of Patent: *Apr. 17, 2001

(54) PASS TRANSISTOR CIRCUIT

(75) Inventors: Shigeki Imai, Nara; Kazuya Fujimoto, Tenri, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/217,809

(22) Filed: Dec. 22, 1998

(30) Foreign Application Priority Data

Dec. 26, 1997 (JP) .................................................... 9-361000

(51) Int. Cl.[7] ......................... H03K 19/20; H03K 19/003
(52) U.S. Cl. ............................................. 326/113; 326/27
(58) Field of Search ................................ 326/113, 119, 326/121, 112, 26, 27

(56) References Cited

U.S. PATENT DOCUMENTS

| 4,893,031 | * | 1/1990 | Masuda | 326/113 |
| 4,963,860 | | 10/1990 | Stewart | 325/206 |
| 5,200,907 | | 4/1993 | Tran | 326/113 |
| 5,399,921 | | 3/1995 | Dobbelaere | 326/113 |
| 5,471,421 | | 11/1995 | Rose et al. | 365/182 |
| 5,528,177 | * | 6/1996 | Sridhar et al. | 326/113 |
| 5,729,155 | * | 3/1998 | Kobatake | 326/68 |
| 5,789,966 | | 8/1998 | Bechade | 327/407 |
| 5,808,483 | * | 9/1998 | Sako | 326/113 |
| 5,898,322 | * | 4/1999 | Kubota et al. | 326/113 |
| 5,936,427 | * | 8/1999 | Tsujihashi | 326/54 |

FOREIGN PATENT DOCUMENTS

| 60-97813 | 4/1994 | (JP) . |
| 8-321770 | 12/1996 | (JP) . |
| 9-162722 | 2/1997 | (JP) . |
| 9-093118 | 4/1997 | (JP) . |
| WO 96/08761 | 3/1996 | (WO) . |

OTHER PUBLICATIONS

White Paper on Low Power Consumptions LSIs, Nikkei Business Publications, Inc., 1994, pp. 98 105.

* cited by examiner

Primary Examiner—Michael Tokar
Assistant Examiner—James Cho

(57) ABSTRACT

A pass transistor circuit of the present invention includes a plurality of pass transistor sections having pass transistor logics and has a logic functionality which is based on a pass transistor logic functionality of a plurality of pass transistor sections. One or more of the pass transistor sections is a CMOSFET formed of a p-type MOSFET and an n-type MOSFET. At least one of the p-type MOSFET and the n-type MOSFET of the CMOSFET is a transistor having a TFT structure.

6 Claims, 11 Drawing Sheets

FIG. 3

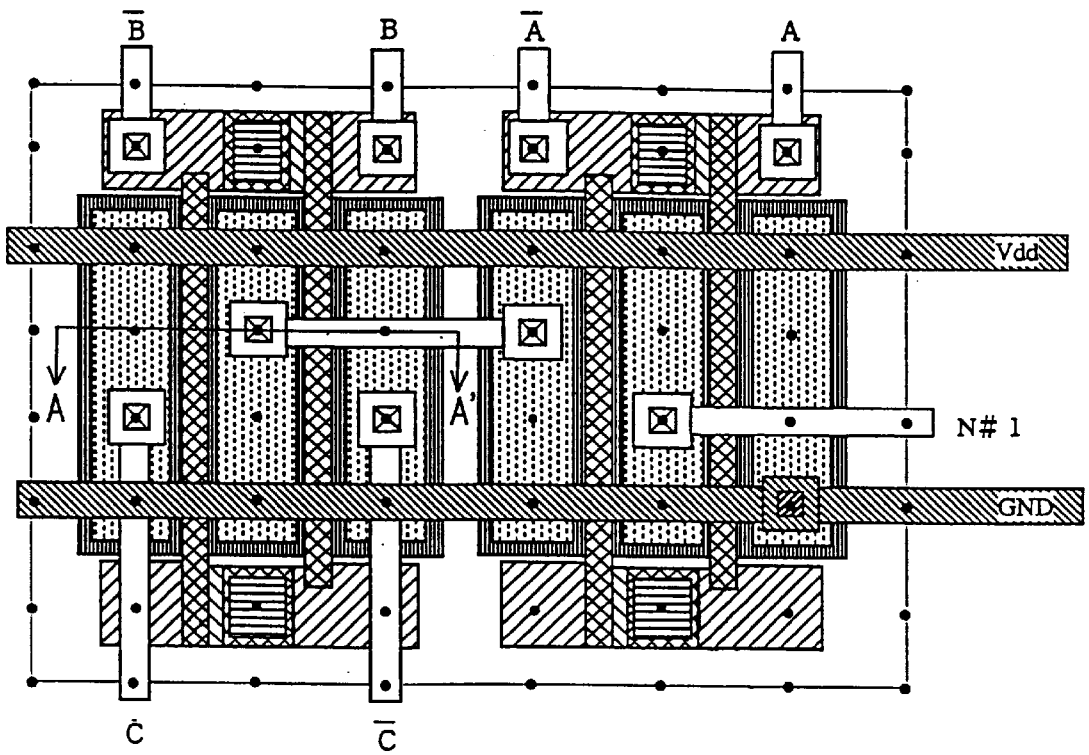

- ▦ Polysilicon for p-type (TFT) transistor body
- ▨ N-type (normal transistor) gate polysilicon
- ☐ First metal layer
- ▩ Second metal layer
- ≡ Contact (Gate polysilicon for TFT gate – polysilicon for n-type transistor)
- ▨ Polysilicon for p-type (TFT) transistor gate
- ⊠ Contact (Polysilicon for TFT transistor body – first metal layer – polysilicon for n-type transistor gate – first metal layer)
- ▨ Stack contact (Polysilicon for TFT body – first metal layer – second metal layer)

- Diffusion
- Gate polysilicon
- First metal layer
- Second metal layer
- ⊠ Contact (Diffusion – first metal layer – gate polysilicon – first metal layer)
- ■ Stack contact ( Diffusion – first metal layer – second metal layer)
- ▨ VIA (First metal layer – second metal layer)

FIG.11
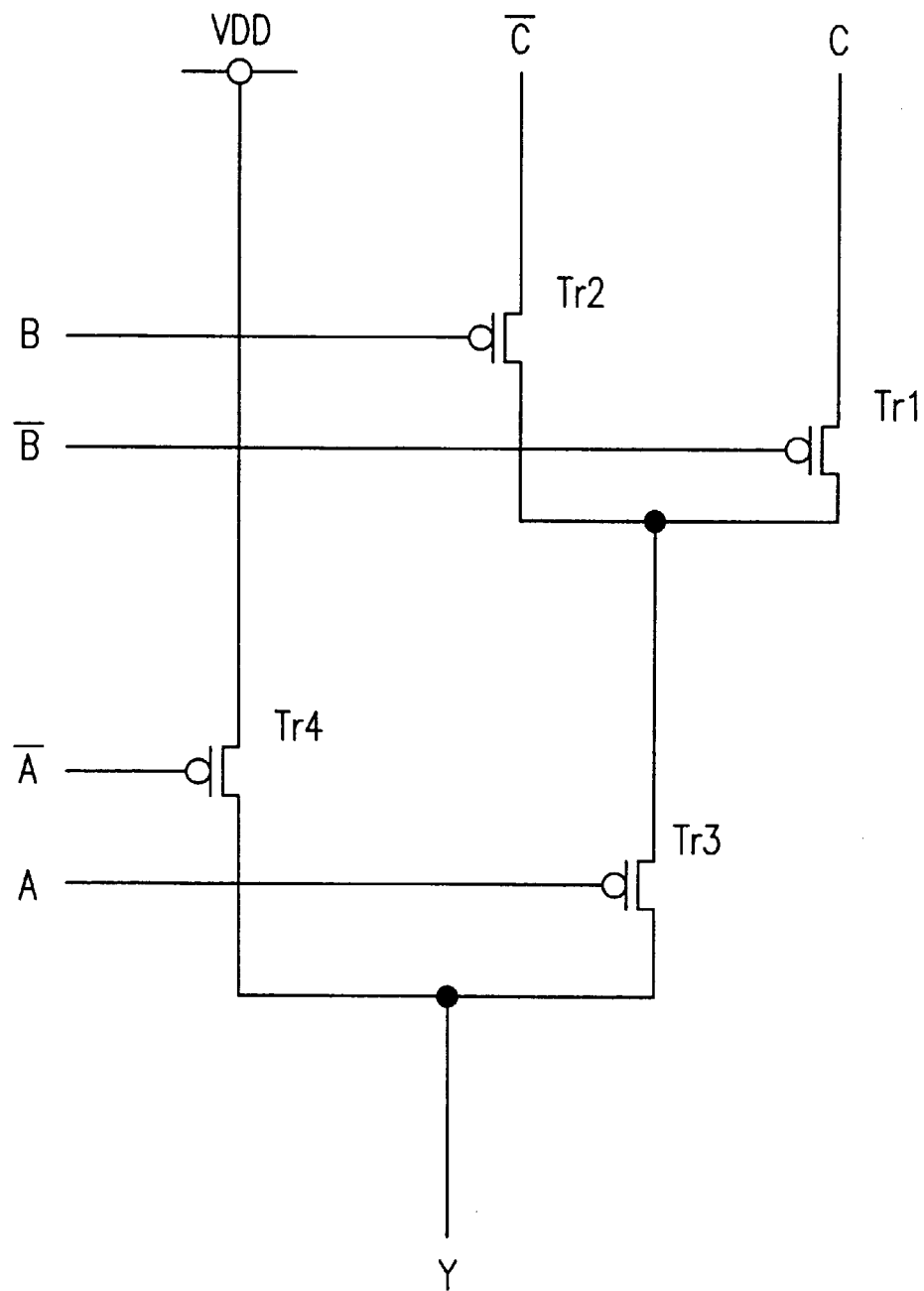
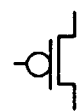 P-type TFT transistor

PASS TRANSISTOR CIRCUIT

BACKGROUND OF THE INVENTION

1. Field of the Invention

The present invention relates to a pass transistor circuits, which includes a plurality of pass transistor sections. More particularly, the present invention relates to a pass transistor circuit produced by a CMOSFET (Complementary Metal-Oxide-Semiconductor Field-Effect Transistor) process utilizing a TFT (Thin Film Transistor) technique.

2. Description of the Related Art

Conventionally, in order to reduce the number of transistors used, a pass transistor circuit is implemented with pass logic sections (pass gates) each formed of either an n-type (n-channel) MOSFET or a p-type (p-channel) MOSFET.

FIGS. 5 and 6 illustrate such a conventional pass transistor circuit. As illustrated in the figures, the pass gate section of the pass transistor circuit includes four transistors Tr1 to Tr4, which are all n-type MOSFETs.

FIG. 7 illustrates another conventional pass transistor circuit. This pass transistor circuit is called a "CVSL (Cascode Voltage Swing Logic)" circuit developed by IBM corporation, where the pass gate sections of the pass transistor circuit are each formed only of an n-type MOSFET.

FIG. 8 illustrates still another conventional pass transistor circuit. This pass transistor circuit is called a "DPL (Double Pass-transistor Logic" developed by Hitachi Ltd, where the pass gate sections of the pass transistor circuit are each formed only of an n-type MOSFET.

The pass transistor circuit diagrams illustrated in FIGS. 5 to 8 are from "White paper on low power consumption LSIs", Nikkei Business Publications Inc.

Other conventional pass transistor circuits include those described in Japanese Laid-open Publication Nos. 8-321770 and 9-93118.

In the pass transistor circuit described in Japanese Laid-open Publication No. 8-321770, the pass gate section is formed only of either an n-type transistor or a p-type transistor.

The pass transistor circuit employs an output-latch-type circuit configuration, in which the output is fully swung, but the pass gate section is again formed only of a single transistor.

As described above, in the conventional pass transistor circuit, the pass gate section is formed only of either an n-type transistor or a p-type transistor.

Referring to FIGS. 6 and 9, a problem associated with such a conventional pass transistor circuit, where the pass gate section is formed only of an n-type MOSFET, will be described. FIG. 9 is a layout diagram illustrating a structure corresponding to that illustrated in FIGS. 5 and 6, with the pass transistor circuit sections being replaced by transistor circuits.

Consider a case where input signals A and B to the pass gate sections are each at a high level, and the n-type transistors Tr2 and Tr4 are both turned ON. When an input signal C is at a low level, an inverted signal C bar (inverted from the signal C) is first transmitted to a node N#1.

However, since the transistors Tr2 and Tr4 are both n-type MOSFETs, the high level signal which equals $V_{DD}$, the positive power supply voltage) is not transmitted therethrough. Therefore, the node N#1 is only charged up to $V_{DD}$–Vthn (where Vthn denotes a threshold voltage of the n-type MOSFET).

Thus, if the circuit of FIG. 6 does not have transistors Tr5, Tr8 and Tr9, a transistor Tr6 is not completely turned OFF, thereby causing a DC current between the transistor Tr6 and a transistor Tr7.

Conventionally, in order to solve this problem, the n-type MOSFET transistors Tr5, Tr8 and Tr9 are provided as auxiliary circuits, as illustrated in FIG. 6.

In this configuration with the auxiliary circuits, as illustrated in FIG. 6, when the node N#1 is initially (i.e.) before the signal C bar (at the high level) is inverted from input signal C and transmitted thereto) set to a low level (equal to GND, or ground level), the transistors Tr6 and Tr8 are ON. When the signal C bar is transmitted therethrough, the transistors Tr7 and Tr9 are then turned ON, a node N#2 is at a low level, and the transistor Tr5 is turned ON. Thus, the node N#1 is charged from $V_{DD}$–Vthn to $V_{DD}$.

When the signal to be transmitted is at the low level, and the node N#1 is initially at the high level, a DC current is generated from the transistor Tr5 toward the signal to be transmitted, and the transistor Tr8 is turned ON by the potential at the node N#1, thereby bringing the node N#2 to the high level. The DC current keeps flowing until the transistor Tr5 is turned OFF. Thus, as the potential at the node N#1 changes from the high level to the low level, the transistor Tr5 and the signal source (low level) collide with each other, thereby generating a DC current flowing from Tr5→Tr4→Tr2→C bar (which is equal to a low level).

As described above, when only the n-type MOSFET is used for the pass gate, due to the characteristics of the n-type transistor, only the signal amplitude "$V_{DD}$–Vthn" of a high level signal is transmitted therethrough.

When only the p-type characteristics MOSFET is used for the pass gate, due to the characteristics of the p-type transistor, only the signal amplitude "GND+|Vthp|" of a low level signal is transmitted therethrough (where Vthp denotes the threshold voltage of the p-type MOSFET).

In order to solve these problems, conventionally, the above-described auxiliary circuits are additionally provided. In such a configuration, however, a temporary or steady DC current occurs in the auxiliary circuits.

This results from the formation of the pass gate using only an n-type MOSFET or a p-type MOSFET.

SUMMARY OF THE INVENTION

According to one aspect of this invention, a pass transistor circuit includes a plurality of pass transistor sections having pass transistor logics and has a logic functionality of a plurality of pass transistor sections. One or more of the pass transistor sections is a CMOSFET formed of a p-type MOSFET and an n-type MOSFET. At least one of the p-type MOSFET and the n-type MOSFET of the CMOSFET is a transistor having a TFT structure.

In one embodiment of the invention, one of the pass transistor sections is formed only of an n-type MOSFET whose source is connected to GND.

In one embodiment of the invention, one of the pass transistor sections is formed only of a p-type MOSFET whose source is connected to a positive power source $V_{DD}$.

In one embodiment of the invention, both of the p-type MOSFET and the n-type MOSFET of the CMOSFET are transistors having a TFT structure.

In one embodiment of the invention, one of the pass transistor sections is formed only of a p-type MOSFET whose source is connected to a positive power source $V_{DD}$.

Functions of the present invention will now be described.

As described above, in the pass transistor circuit of the present invention, some or all of a plurality of pass transistor sections are CMOSFETs each including an n-type MOSFET and a p-type MOSFET. Thus, for reasons set forth below, the auxiliary circuits (Tr5, Tr8 and Tr9) illustrated in FIGS. 5 and 6, which are required in the conventional pass transistor circuit, are not necessary, thereby eliminating a through current caused by the auxiliary circuits.

In the conventional pass transistor circuit where each pass transistor section is formed only of an n-type MOSFET, a high level signal passes through the gate with the potential thereof being $V_{DD}$−Vthn. According to the present invention, a p-type transistor is additionally provided along with the n-type MOSFET, thereby transmitting the high level signal with the potential thereof being $V_{DD}$.

In the conventional pass transistor circuit where each pass transistor section is formed only of a p-type MOSFET, a low level signal passes through the gate with the potential thereof being GND+|Vthp|. According to the present invention, an n-type transistor is additionally provided along with the p-type MOSFET, thereby transmitting the low level signal with the potential thereof being GND.

Therefore, according to the present invention, the auxiliary circuits (Tr5, Tr8 and Tr9), illustrated in FIGS. 5 and 6, are not necessary, thereby eliminating a through current caused by the auxiliary circuits.

In addition, according to the present invention, at least one of the n-type MOSFET and the p-type MOSFET of the CMOSFET is produced by a TFT process. Therefore, it is possible to produce transistors of opposite types within the same area. Thus, unlike an ordinary bulk-type CMOS, it is not necessary to individually produce the n-type MOSFET and the p-type MOSFET in separate areas. As a result, it is possible to reduce any increase in area needed from that of a pass transistor logic circuit which only includes transistors of one type.

Not all of the pass transistor sections have to be CMOSFETs formed of an n-type MOSFET and a p-type MOSFET. The pass transistor section whose source is connected to GND may be formed only of an n-type MOSFET. The pass transistor section whose source is connected to the positive power supply $V_{DD}$ may be formed only of a p-type MOSFET. The reasons for this will be set forth in the following description of the preferred embodiments.

Thus, the invention described herein makes possible the advantages of (1) providing a pass transistor circuit through which the potentials $V_{DD}$ and GND can be transmitted without being changed, and in which an auxiliary circuit does not need to be provided in the pass gate section, whereby the size of the pass transistor circuit can be reduced; (2) providing a pass transistor circuit in which an auxiliary circuit does not need to be provided in the pass gate section, whereby it is possible to eliminate a through current (DC current) caused by the auxiliary circuit; (3) providing a pass transistor circuit which can be produced by a TFT process, whereby it is possible to produce transistors of opposite types within the same area, and thus to minimize any increase in area needed from that of a pass transistor logic circuit which only includes transistors of one type.

These and other advantages of the present invention will become apparent to those skilled in the art upon reading and understanding the following detailed description with reference to the accompanying figures.

BRIEF DESCRIPTION OF THE DRAWINGS

FIG. 3 is a layout diagram illustrating a pass transistor circuit of the present invention;

FIG. 11 is a circuit diagram illustrating a pass transistor circuit according to Example 3 of the present invention;

DESCRIPTION OF THE PREFERRED EMBODIMENTS

The present invention will now be described by way of illustrative examples with reference to the accompanying figures.

EXAMPLE 1

Figure 1:
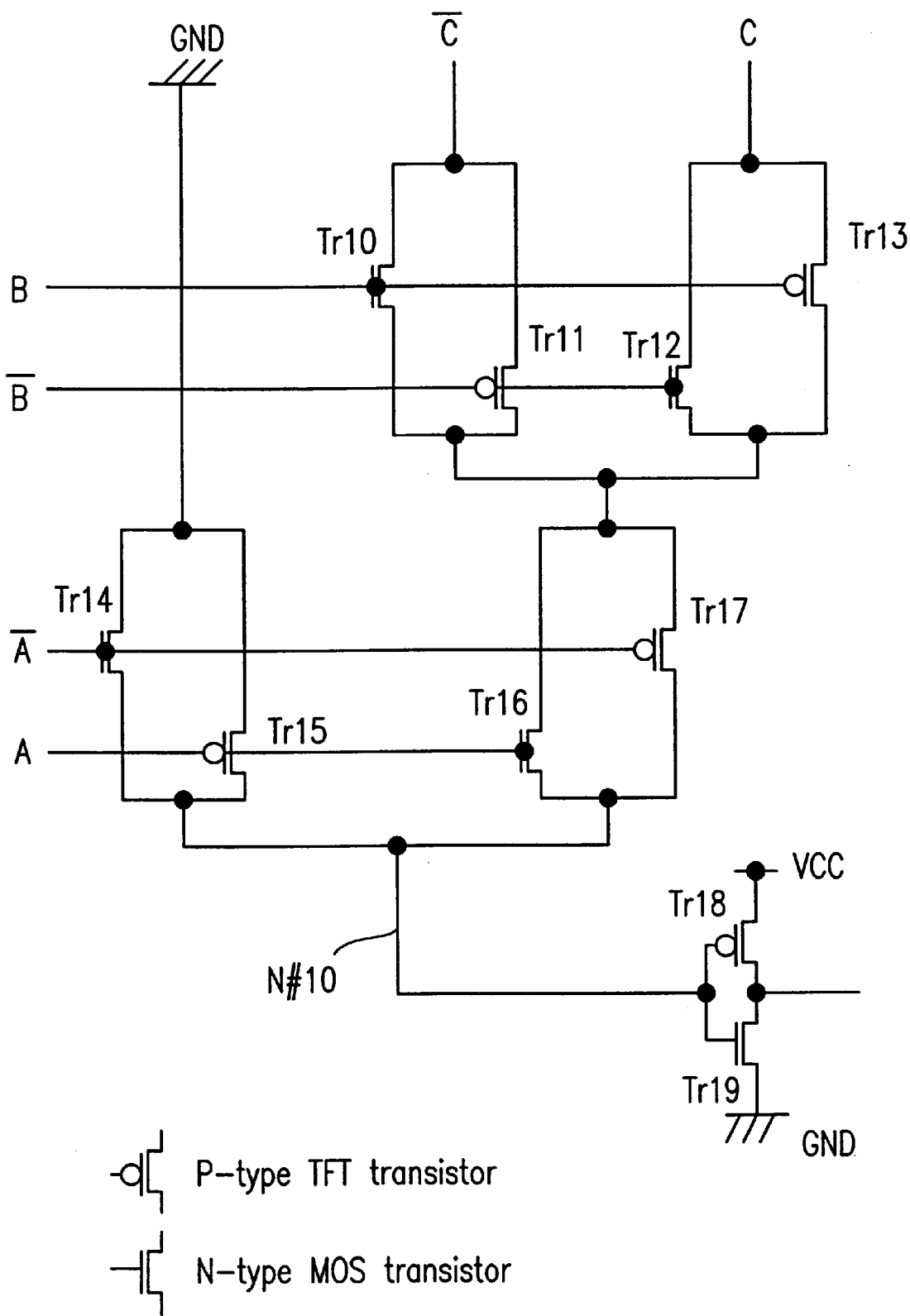
FIG. 1 is a circuit diagram illustrating a pass transistor circuit according to Example 1 of the present invention.

FIG. 1 illustrates a pass transistor circuit according to Example 1 of the present invention. A pass transistor section (pass transistor gate section) of this pass transistor circuit employs a CMOSFET formed of an n-type MOSFET and a p-type MOSFET. This makes the pass transistor circuit different from the conventional pass transistor circuit illustrated in FIGS. 5 and 6.

According to the present invention, one or both of the n-type MOSFET and the p-type MOSFET is produced by a TFT process. In this example, the p-type MOSFET is produced by the TFT process.

Referring to FIG. 1, the pass transistor circuit of Example 1 includes pass transistor sections which are CMOSFETs each formed of an n-type MOSFET (Tr10, Tr12, Tr14 and Tr16) and a p-type MOSFET (Tr11, Tr13, Tr15 and Tr17).

An operation of the pass transistor circuit will now be described. When input signals A and B are each at a high level, the n-type MOSFET Tr16 and the n-type MOSFET Tr10 are ON. At this time, the p-type MOSFET Tr11 and the p-type MOSFET Tr17, to which inverted signals A bar and B bar (inverted from the signals A and B, respectively), are also ON.

Under this condition, if the signal C is at the low level, the inverted signal C bar (i.e., at a high level) of the signal C is transmitted to a node N#10 via the n-type MOSFET Tr10, the p-type MOSFET Tr11, the n-type MOSFET Tr16 and the p-type MOSFET Tr17.

If there are only pass transistor gates which are formed of the n-type MOSFET Tr10 and the n-type MOSFET Tr16, as in the conventional pass transistor circuit, a voltage $V_{DD}$−Vthn will be transmitted to the node N#10. In Example 1, however, the high level voltage $V_{DD}$ is transmitted due to the p-type MOSFET Tr11 and the p-type MOSFET Tr17.

As a result, the potential at the gate of a MOSFET Tr18 connected to the node N#10 increases to $V_{DD}$, whereby the p-type MOSFET Tr18 will be completely OFF. During the gate voltage transition, a through current, as that generated in an ordinary CMOS circuit (CMOSFET), is generated between the p-type MOSFET Tr18 and an n-type MOSFET Tr19. In Example 1, however, since a voltage $V_{DD}$ is supplied to the node N#10, the through current is stopped and will not be a steady current flow.

Figure 5:
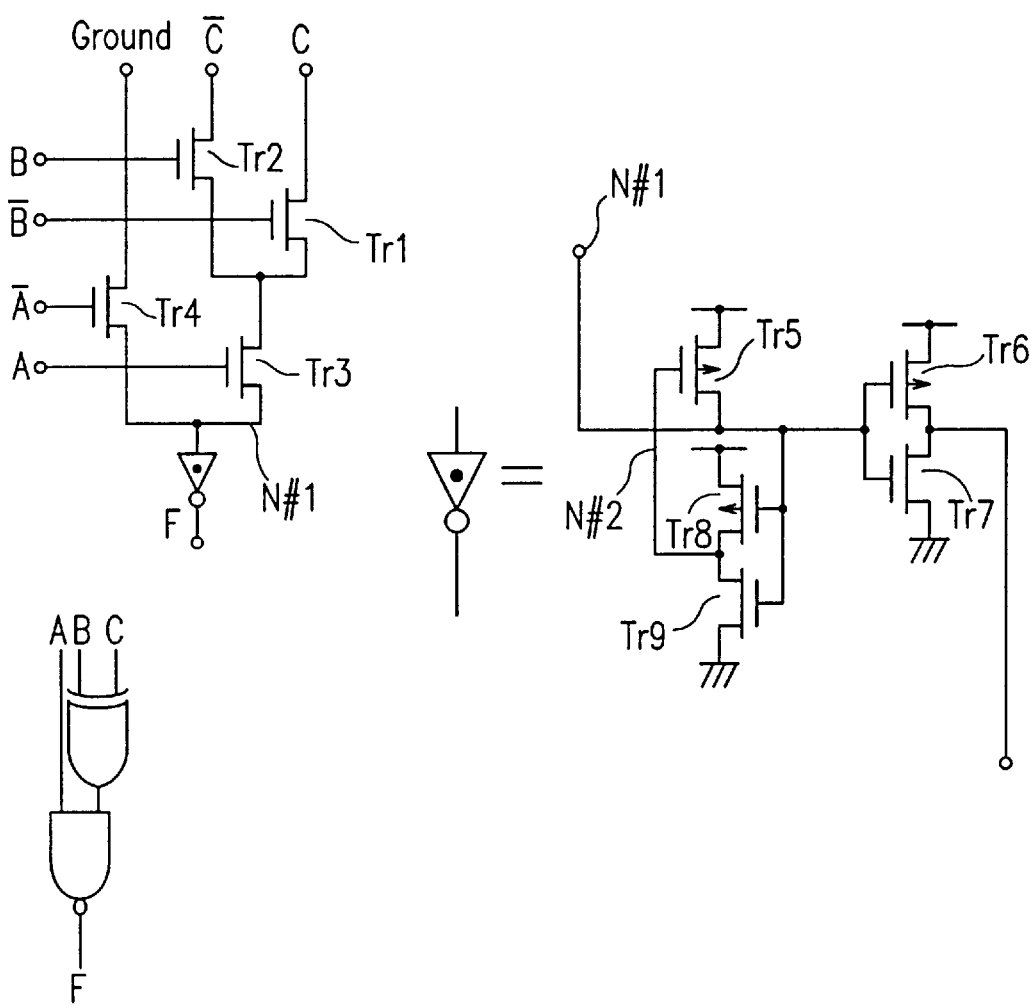
FIG. 5 is a circuit diagram illustrating a conventional pass transistor circuit formed only of an n-type MOSFET.
Figure 6:
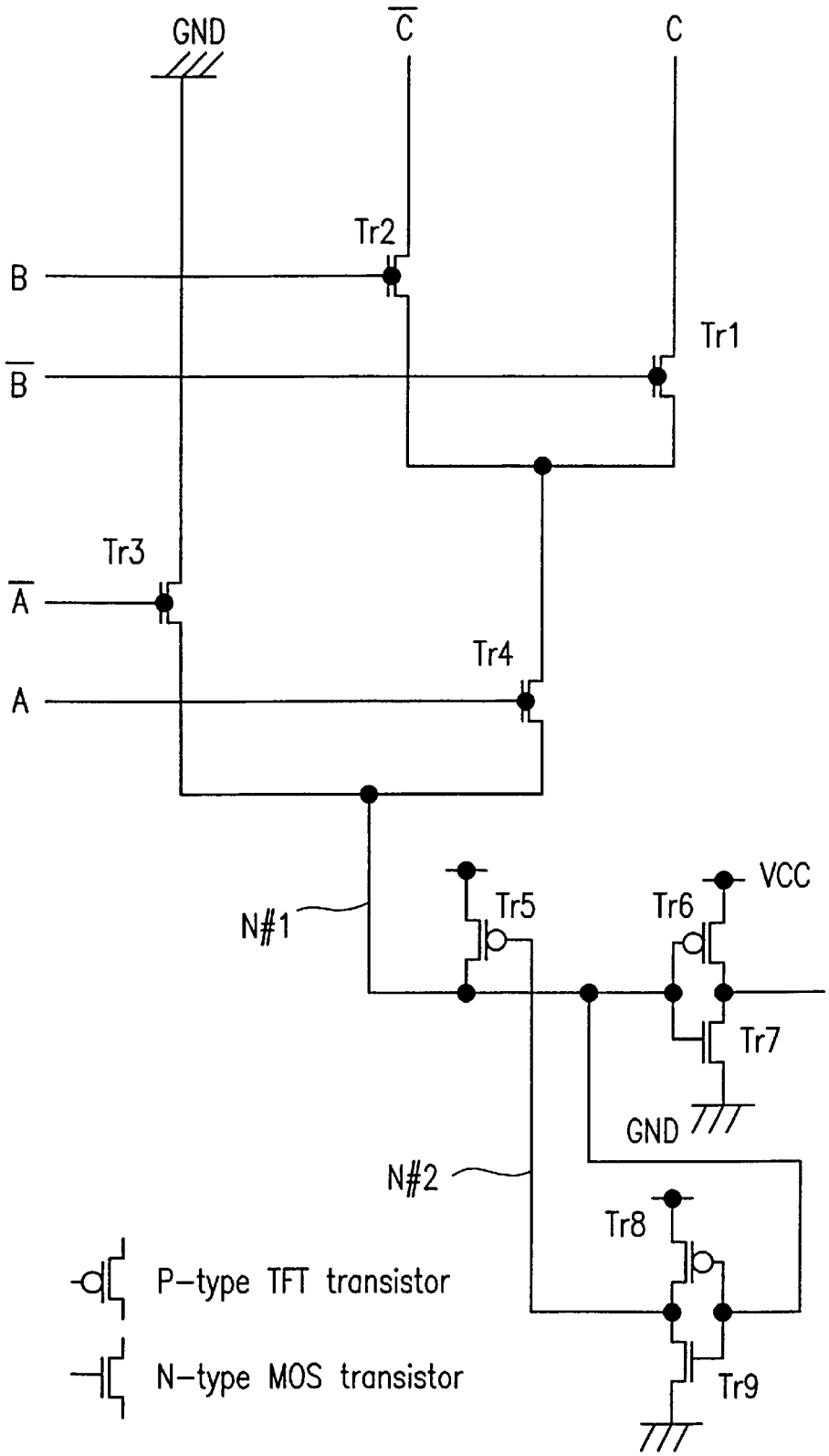
FIG. 6 is a circuit diagram illustrating a conventional pass transistor circuit corresponding to the circuit illustrated in FIG. 4.
Figure 7:
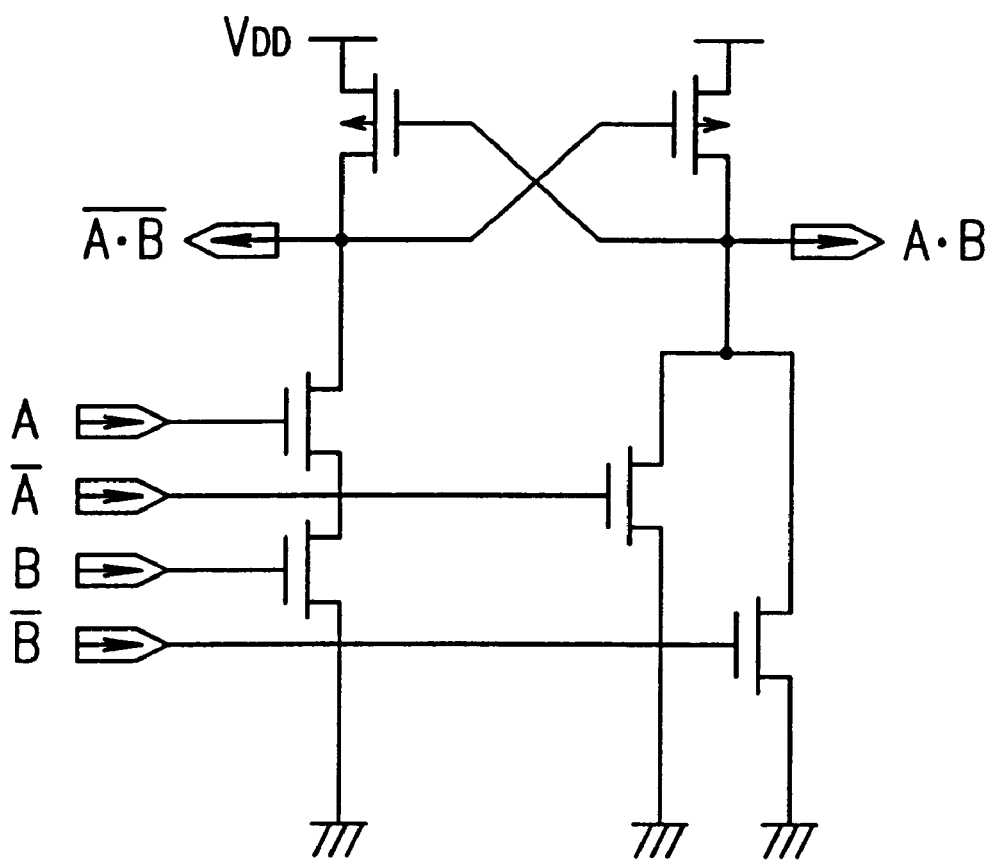
FIG. 7 is a circuit diagram illustrating a known CVSL circuit.
Figure 8:
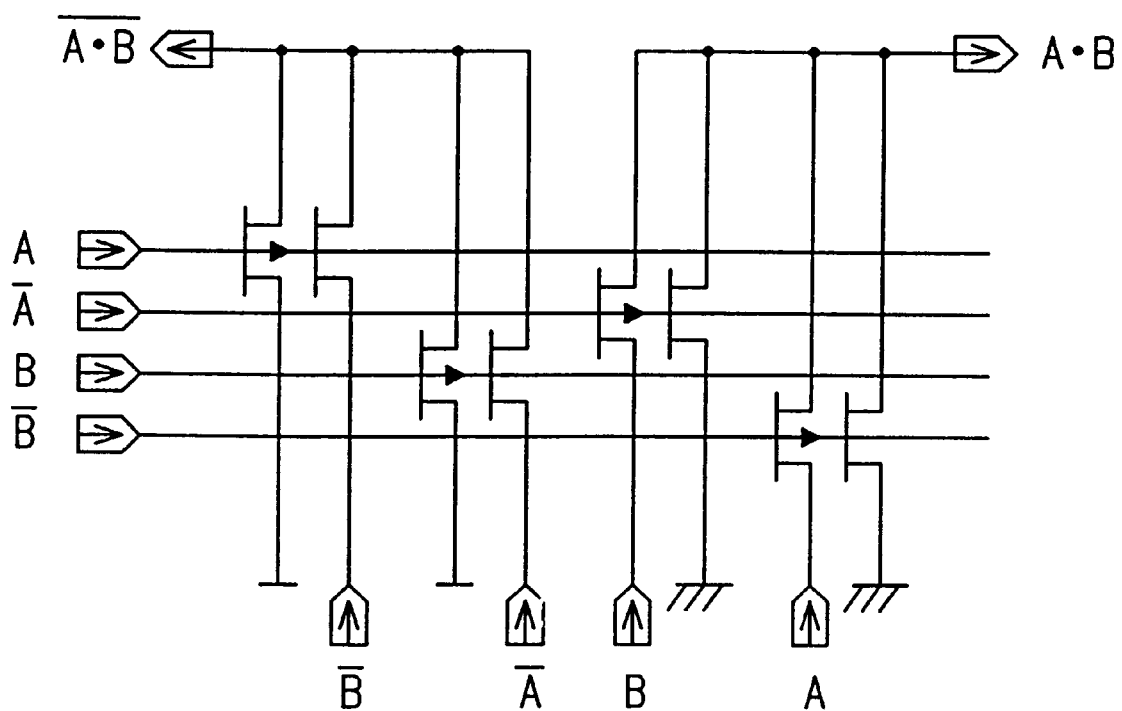
FIG. 8 is a circuit diagram illustrating a known DPL circuit.

As a result, according to Example 1 of the present invention, the auxiliary circuits (the n-type MOSFETs Tr5, Tr8 and Tr9 provided in the conventional circuit illustrated in FIGS. 5 and 6) are not necessary.

EXAMPLE 2

Figure 2:
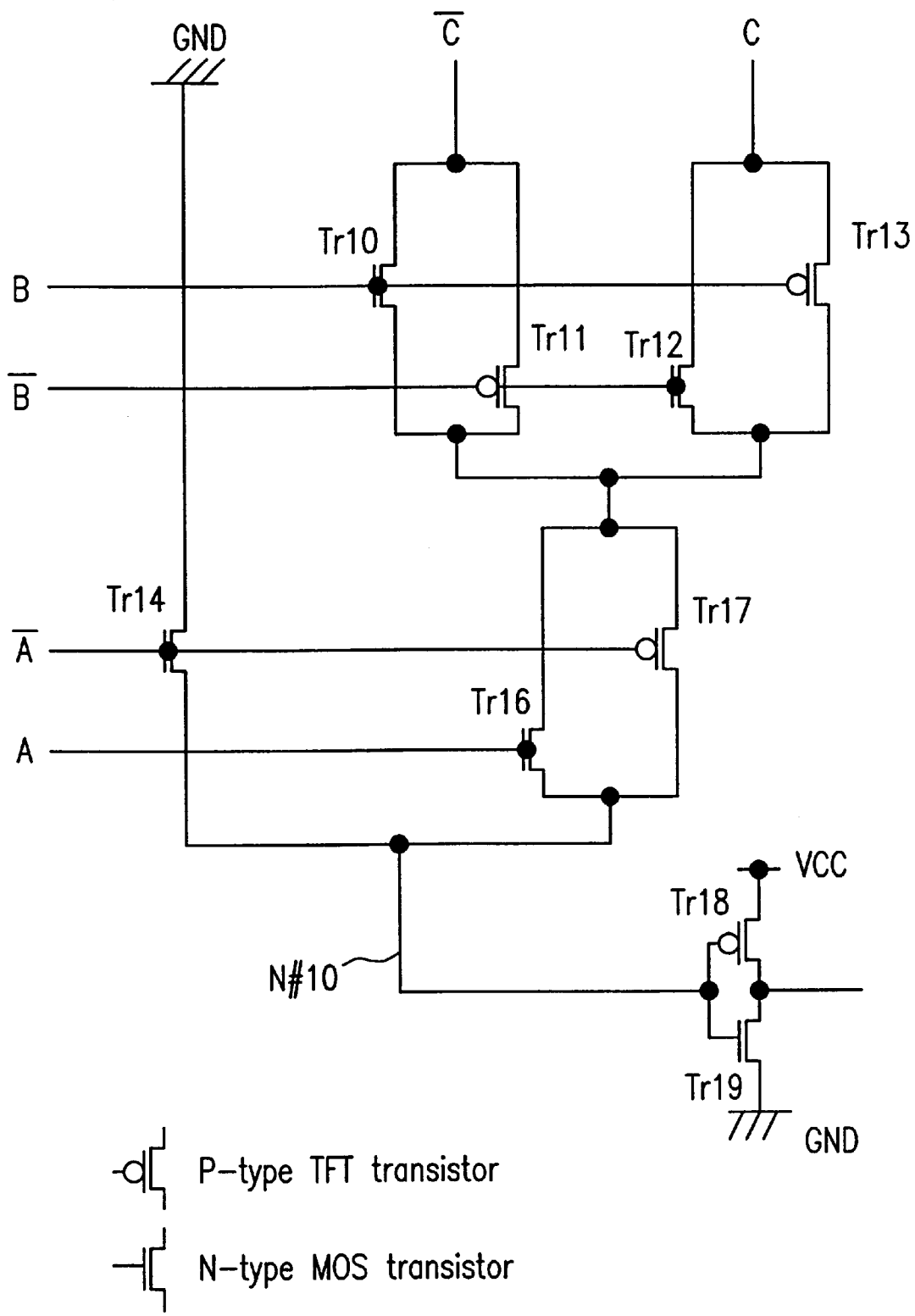
FIG. 2 is a circuit diagram illustrating a pass transistor circuit according to Example 2 of the present invention.

FIG. 2 illustrates a pass transistor circuit according to Example 2 of the present invention. A pass transistor gate of this pass transistor circuit connected to GND is formed only of the n-type MOSFET Tr14. This makes the pass transistor circuit different from the pass transistor circuit of Example 1, where the corresponding pass transistor gate is formed of the n-type MOSFET Tr14 and the p-type MOSFET Tr15. The pass transistor gate, which is connected to GND and which only transmits a signal fixed at a GND level, can be formed only of the n-type MOSFET Tr14 for the following reasons.

In the pass transistor circuit illustrated in FIG. 1, when the input signals A is at the low level, the GND-level signal is transmitted to the node N#10 via the n-type MOSFET Tr14 and the p-type MOSFET Tr15 (the pass transistor gate).

Since the MOSFET Tr15 is a p-type MOSFET, the GND-level of the signal becomes GND+|Vthp| after passing through the p-type MOSFET Tr15 and being transmitted to the node N#10. Since the MOSFET Tr14 is an n-type MOSFET, the GND level is transmitted through the n-type MOSFET Tr14 without being changed.

Thus, the circuit section which only transmits a signal fixed at the GND level, i.e., the pass transistor gate, does not have to employ a CMOSFET formed of the n-type MOSFET Tr14 and the p-type MOSFET Tr15, but can alternatively be formed only of the n-type MOSFET Tr14.

EXAMPLE 3

FIG. 11 illustrates a pass transistor circuit according to Example 3 of the present invention. For the reasons set forth above, the pass transistor gate which only transmits the positive power supply voltage $V_{DD}$ can be formed only of a p-type MOSFET.

As described above, in the pass transistor circuit of the present invention, all of the pass transistor gates can be CMOSFETs each formed of an n-type MOSFET and a p-type MOSFET. Alternatively, the pass transistor circuit which only transmits a signal fixed at the GND level can be formed of an n-type MOSFET, while each of the other pass transistor gates can be formed of a CMOSFET. Alternatively, the pass transistor circuit which only transmits the positive power supply voltage $V_{DD}$ can be formed of a p-type MOSFET, while each of the other pass transistor gates can be formed of a CMOSFET.

Figure 4:
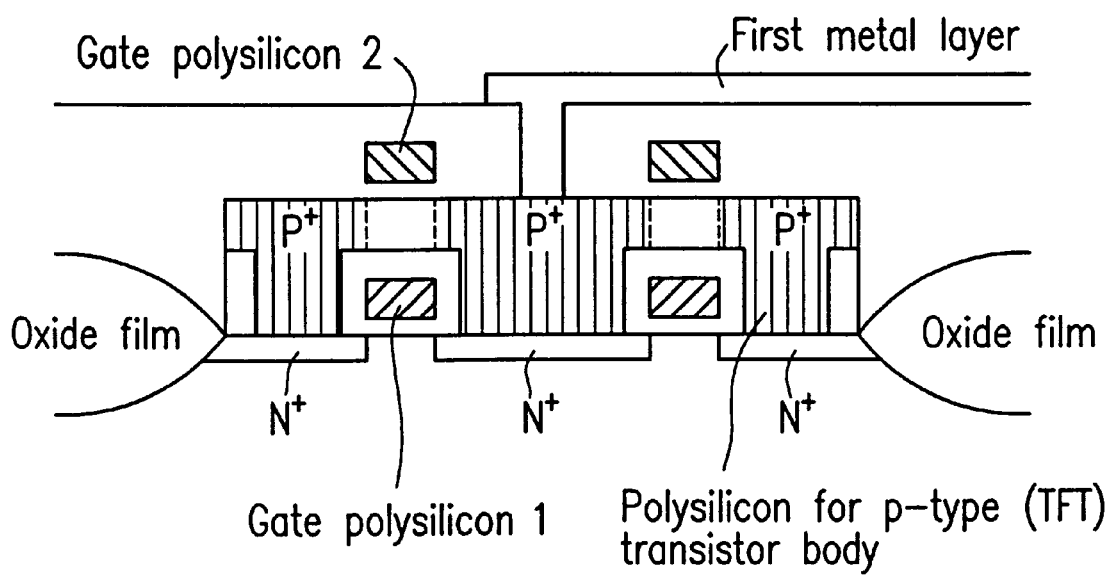
FIG. 4 is a cross-sectional view taken along line A–A' of FIG. 3.

In the pass transistor circuits of Examples 1 to 3 of the present invention, the pass transistor circuit formed of a pair of an n-type MOSFET and a p-type MOSFET is produced by the TFT process. FIG. 3 illustrates an exemplary layout diagram where the p-type MOSFET is produced by a TFT process. FIG. 4 is a cross-sectional view taken along line A–A' of FIG. 3. An advantage obtained when the pass transistor gate is produced by the TFT process will be described below with reference to FIGS. 3, 9 and 10.

Figure 9:
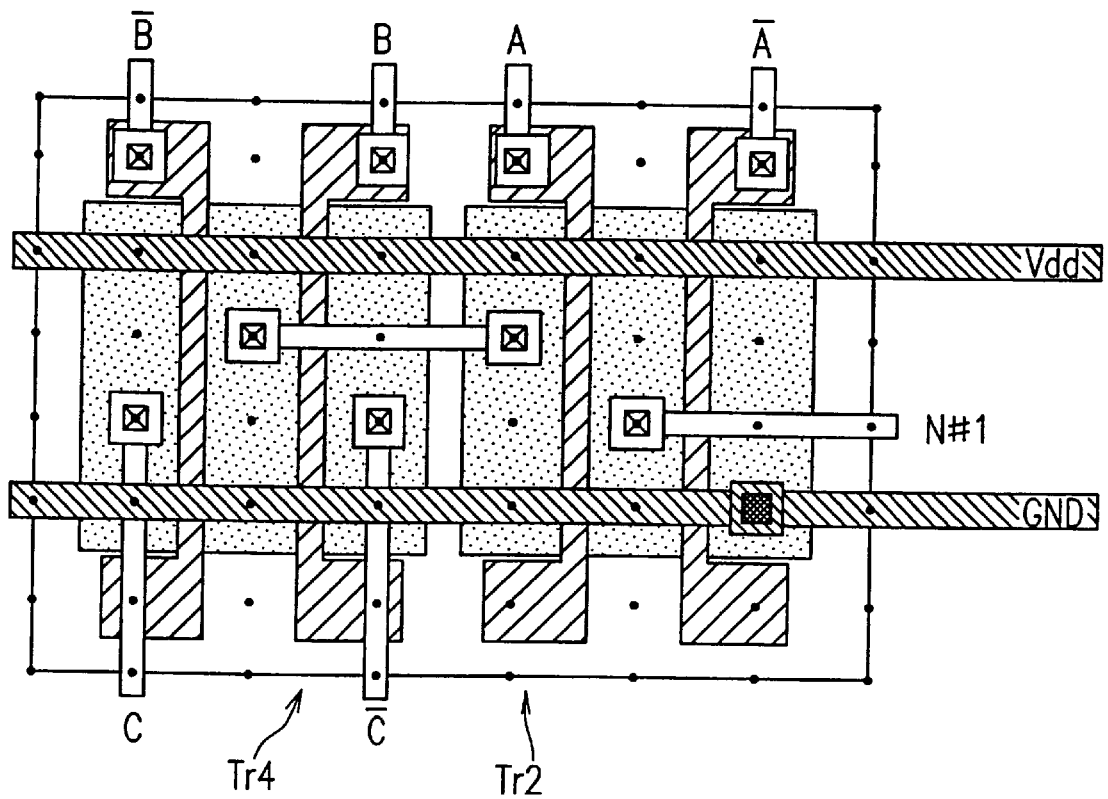
FIG. 9 is a layout diagram illustrating the circuit illustrated in FIGS. 5 and 6.
Figure 10:
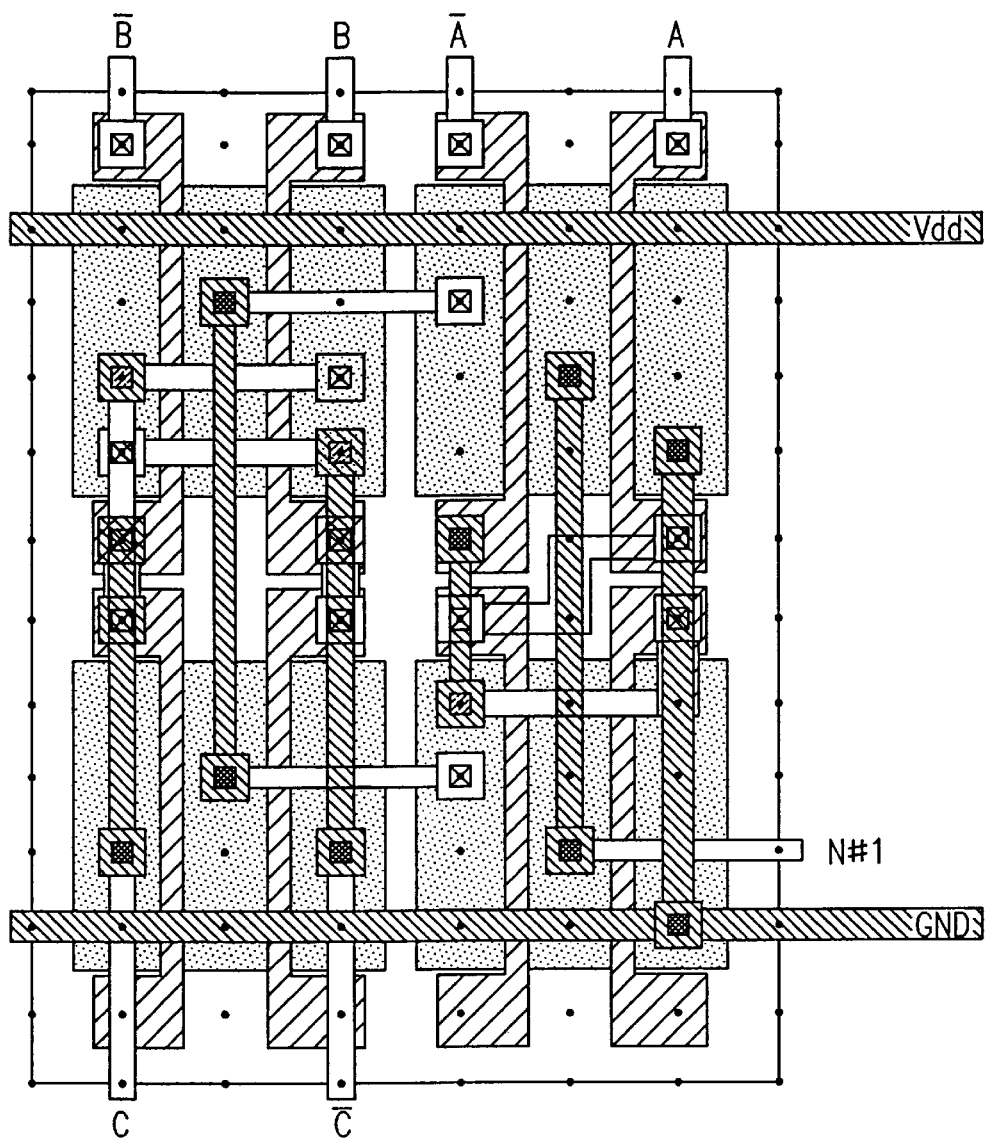
FIG. 10 is a layout diagram illustrating a conventional CMOS circuit.

FIG. 9 illustrates a layout diagram where the pass transistor gate is formed only of an n-type MOSFET. FIG. 10 illustrates a layout diagram where the pass transistor gate is formed of a conventional CMOS circuit provided on a silicon substrate.

FIGS. 3, 9 and 10 illustrate circuit components such as a diffusion region, polysilicon gates 1 and 2 and a first metal layer.

The result of a layout area comparison conducted among the pass transistor circuits of FIGS. 3, 9 and 10 will be described below.

The area varies depending upon the particular design rule employed or the particular layout method employed (even when employing the same design rule). Therefore, the area comparison was conducted based on the number of grids (denoted by black dots in the figures) required for implementing the same circuit. The size of a transistor is considered equivalent to three grids. A stack contact is permissible in this layout methodology, and in addition, the contacts are allowed to be adjacent to one another. A cell frame grid row is provided on both sides (upper and bottom sides) of the cell.

The number of grids in the pass transistor circuit of FIG. 9 formed only of an n-channel transistor is 8×8=64; the number of grids in the conventional CMOS transistor circuit illustrated in FIG. 10 is 8×14=112; and the number of grids of the pass transistor circuit of the present invention illustrated in FIG. 3 is 8×8=64.

The comparison shows that the pass transistor circuit of the present invention where the p-type MOSFET is produced by the TFT process can be implemented within the same area as that in the conventional case where the pass transistor circuit is formed only of an n-type transistor, while achieving an operation similar to that of a CMOS transistor process (with no increase or decrease in voltage by $V_{th}$ occurring at each node).

More particularly, a conventional CMOS process, or the like, requires well separation, etc., thereby necessarily increasing the chip size. A simple calculation will show that it should require an area about twice as large as that of a single channel (i.e., p-channel or n-channel) circuit.

According to the present invention, one or both of the n-type MOSFET and the p-type MOSFET is produced by the TFT process. More particularly, a transistor is produced by the TFT process by depositing layers on the conventional single channel section (e.g., the n-type transistor section). Thus, the present invention realizes a pass transistor circuit having the same (2-dimensional) size as that of the prior art, while solving the problems such as requiring an auxiliary circuit and generating a through current due to the auxiliary circuit. The TFT process is well-known in the art, and described in Japanese Laid-open Publication Nos. 5-102483 and 6-5860, for example.

Thus, the present invention provides an advantage of providing a pass transistor logic circuit in which the auxiliary circuit and the through current associated therewith can be eliminated while minimizing the increase in the chip area.

As described above, when a pass transistor section is formed of an n-type MOSFET and a p-type MOSFET, it is possible to eliminate the necessity of providing the auxiliary circuits (which are required in the conventional pass transistor circuit), and thus to eliminate a through current caused by the auxiliary circuits.

In addition, when at least one of the n-type MOSFET and the p-type MOSFET is produced by the TFT process, it is possible to minimize the increase in the chip area. When both of the n-type MOSFET and the p-type MOSFET are produced by the TFT process, it is possible to further reduce the chip area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A pass transistor circuit, comprising:

a plurality of pass transistor sections having pass transistor logics, wherein one or more of the pass transistor sections is a CMOSFET formed of a p-type MOSFET and an n-type MOSFET, wherein an output of a first and second pass transistor section is input into a third pass transistor section, which has an output connected to a fourth pass transistor section, an input wherein of the fourth pass transistor section is connected to ground; and wherein said p-type MOSFET enables a high level input voltage to be transmitted to a node at outputs of said third and fourth transistor sections without being affected by a threshold voltage of an n-type MOSFET in said one or more pass transistor sections.

2. A pass transistor circuit according to claim 1, wherein at least one of the p-type MOSFET and the n-type MOSFET of the CMOSFET is a transistor having a TFT structure.

3. A pass transistor circuit according to claim 2, wherein both of the p-type MOSFET and the n-type MOSFET of the CMOSFET are transistors having a TFT structure.

4. A pass transistor circuit according to claim 1, wherein one of the pass transistor sections is formed only of an n-type MOSFET whose source is connected to GND.

5. A pass transistor circuit according to claim 4, wherein one of the pass transistor sections is formed only of a p-type MOSFET whose source is connected to a positive power source $V_{DD}$.

6. A pass transistor circuit according to claim 1, wherein one of the pass transistor sections is formed only of a p-type MOSFET whose source is connected to a positive power source $V_{DD}$.

* * * * *